(12) United States Patent
Lv

(10) Patent No.: US 10,927,444 B2
(45) Date of Patent: Feb. 23, 2021

(54) MASK CARRIER AND EVAPORATION SYSTEM

(71) Applicants: BOE Technology Group Co., Ltd., Beijing (CN); Ordos Yuansheng Optoelectronics Co., Ltd., Ordos (CN)

(72) Inventor: Shouhua Lv, Beijing (CN)

(73) Assignees: BOE Technology Group Co., Ltd., Beijing (CN); Ordos Yuansheng Optoelectronics Co., Ltd., Ordos (CN)

( * ) Notice: Subject to any disclaimer, the term of this patent is extended or adjusted under 35 U.S.C. 154(b) by 141 days.

(21) Appl. No.: 16/113,065

(22) Filed: Aug. 27, 2018

(65) Prior Publication Data

US 2019/0071763 A1    Mar. 7, 2019

(30) Foreign Application Priority Data

Sep. 6, 2017  (CN) .......................... 201710797457.3

(51) Int. Cl.
| | |
|---|---|
| C23C 14/04 | (2006.01) |
| C23C 14/12 | (2006.01) |
| C23C 14/24 | (2006.01) |
| H01L 51/00 | (2006.01) |
| H01L 51/56 | (2006.01) |

(52) U.S. Cl.
CPC ............ *C23C 14/042* (2013.01); *C23C 14/12* (2013.01); *C23C 14/24* (2013.01); *H01L 51/001* (2013.01); *H01L 51/56* (2013.01); *H01L 51/0011* (2013.01)

(58) Field of Classification Search
CPC .................................................. C23C 14/042
See application file for complete search history.

(56) References Cited

U.S. PATENT DOCUMENTS

| | | | | |
|---|---|---|---|---|
| 5,608,773 A | * | 3/1997 | Korenaga | ............... G03F 7/707 378/208 |
| 5,681,638 A | * | 10/1997 | Korenaga | ............... G03F 7/707 269/156 |
| 2016/0301006 A1 | * | 10/2016 | Obata | ................. H01L 51/0021 |
| 2018/0087143 A1 | * | 3/2018 | Moon | ..................... H01L 51/56 |

* cited by examiner

*Primary Examiner* — Keath T Chen
(74) *Attorney, Agent, or Firm* — Fay Sharpe LLP

(57) ABSTRACT

A mask carrier and an evaporation system are provided. The mask carrier includes a base and at least two correction fixtures. The at least two correction fixtures are configured to clamp, on the base, a framework of a metal mask which is used for evaporation on the base, the base has a first opening through which organic material passes, and the at least two correction fixtures are around the first opening in a spaced manner. During organic evaporation coating, the at least two correction fixtures on the mask carrier press the framework of the metal mask to prevent the framework from deformation. Thus, a clearance between a substrate and the metal mask is reduced or even eliminated after the substrate is in press-fit with surface of the metal mask. Patterns obtained through evaporation are clear in shape and outline and normal in size. Hence, the product yield is increased.

18 Claims, 7 Drawing Sheets

MASK CARRIER AND EVAPORATION SYSTEM

This application claims priority to Chinese Patent Application No. 201710797457.3, filed with the State Intellectual Property Office on Sep. 6, 2017 and titled "MASK CARRIER AND EVAPORATION SYSTEM", the entire contents of which are incorporated herein by reference.

TECHNICAL FIELD

The present disclosure relates to a mask carrier and an evaporation system.

BACKGROUND

The organic evaporation coating technology is an important preparation method of an organic film layer in an organic light emitting diode (OLED) When the organic evaporation coating technology is adopted to prepare the organic film layer, a high-precision metal mask is used as a mould. An organic material is heated to be volatilized at a high-temperature and then the volatilized organic material penetrates an opening of the mask in a molecular state to be evaporated on a substrate.

Particularly, the metal mask comprises a framework and a metal mask sheet provided with an opening and welded on the framework. During evaporation, the framework is disposed on a hollow carrier. The substrate to be evaporated is placed on the metal mask sheet in a fitting manner. A magnetic device is arranged on the side, facing away from the metal mask sheet, of the substrate to be evaporated. By the magnetic device, the metal mask sheet is attracted onto the substrate to be evaporated. The organic material is heated under the carrier to be volatilized at a high temperature, and then the volatilized organic material penetrates the carrier and the framework and is evaporated on the substrate through the opening.

SUMMARY

Embodiments of the present disclosure provide a mask carrier and an evaporation system.

At least one embodiment of the present disclosure provides a mask carrier, comprising a base and at least two correction fixtures disposed on the base, wherein the at least two correction fixtures are configured to clamp a framework of a metal mask on the base, the metal mask is placed on the base and is used for evaporation, a first opening that allows an organic material to pass is disposed on the base, and the at least two correction fixtures are disposed around the first opening in a spaced manner.

Optionally, each of the correction fixtures comprises a support rod, an L-shaped connecting rod and a press-fit plate for compressing the framework, one end of the support rod is mounted on the base, the other end of the support rod is connected to one end of the L-shaped connecting rod, and the press-fit plate is disposed at the other end of the L-shaped connecting rod.

Optionally, an accommodating cavity is formed in the base, a second opening that is communicated with the accommodating cavity is formed in a top surface of the base, the correction fixture has a first state and a second state, is disposed inside the accommodating cavity when in the first state and outside the accommodating cavity when in the second state, and is configured to clamp the framework on the base, and the second opening allows the correction fixture, which is switched from the first state to the second state, to pass.

Optionally, one end of the support rod is rotatably mounted in the accommodating cavity, the support rod may rotate between a first position and a second position around one end of its own, a length direction of the support rod is perpendicular to the top surface of the base when the support rod is in the second position, and the correction fixture is in the first state when the support rod is in the first position.

Optionally, the second opening comprises a long slot and an end portion hole connected to one end of the long slot, a length direction of the long slot is perpendicular to a rotating shaft around which one end of the support rod rotates, a projection of the support rod on the top surface of the base is situated in the long slot when the correction fixture is in the first state, and the end portion hole allows the L-shaped connecting rod and the press-fit plate to pass when the support rod rotates.

Optionally, the correction fixture further comprises a power unit configured to drive the support rod to rotate and connected to the support rod.

Optionally, the power unit comprises a motor that is disposed in the accommodating cavity, and an output shaft of the motor is coaxially connected to the rotating shaft of the support rod.

Optionally, the power unit comprises a telescopic cylinder and a mounting base, one end of the support rod is mounted on the mounting base, one end of the telescopic cylinder is rotatably connected to the bottom of the accommodating cavity, the other end of the telescopic cylinder is rotatably connected to the middle of the support rod, and the support rod is in the second position when the telescopic cylinder extends to a first length, and is in the first position when the telescopic cylinder retracts to a second length.

Optionally, the support rod is a telescopic rod.

Optionally, the telescopic rod is a hydraulic rod or an electric lifting screw.

Optionally, the mask carrier further comprises a control unit, wherein the control unit is configured to control the power unit to drive the support rod to rotate from the first position to the second position when receiving a first instruction, to control the support rod to retract when the support rod is in the second position, to control the support rod to extend when receiving a second instruction, and to control the power unit to drive the support rod to rotate from the second position to the first position after the support rod extends.

Optionally, a slideway is disposed in the accommodating cavity and extends from the lower portion of the second opening to the middle of the base, and the correction fixture is mounted on the slideway in a slideable manner.

Optionally, the support rod of the correction fixture is rotatably disposed on the base, the rotating shaft of the support rod is superimposed with an axis of the support rod, the support rod rotates to drive the press-fit plate to switch between a third position and a fourth position, the press-fit plate presses the framework when in the third position, and the projection of the support rod on the top surface of the base is situated between a projection of the press-fit plate on the top surface of the base and a projection of the framework on the top surface of the base when the press-fit plate is in the fourth position.

Optionally, the mask carrier comprises four correction fixtures that are respectively disposed at four edges or four vertexes of a rectangle, wherein the four vertexes of the rectangle correspond to four corners of the framework on the base.

At least one embodiment of the present disclosure provides an evaporation system, comprising an evaporation chamber, as well as a mask carrier and a metal mask that are disposed in the evaporation chamber, the metal mask is disposed on the mask carrier, and the mask carrier is any one of the mask carriers described in the first aspect.

DETAILED DESCRIPTION

The embodiments of the present disclosure will be described in further detail with reference to the enclosed drawings, to make the principles and advantages of the present disclosure clearer.

For convenience of the following description, firstly, application scenarios of a mask carrier provided by an embodiment of the present disclosure will be described below with reference to FIGS. 1-3.

Figure 1:
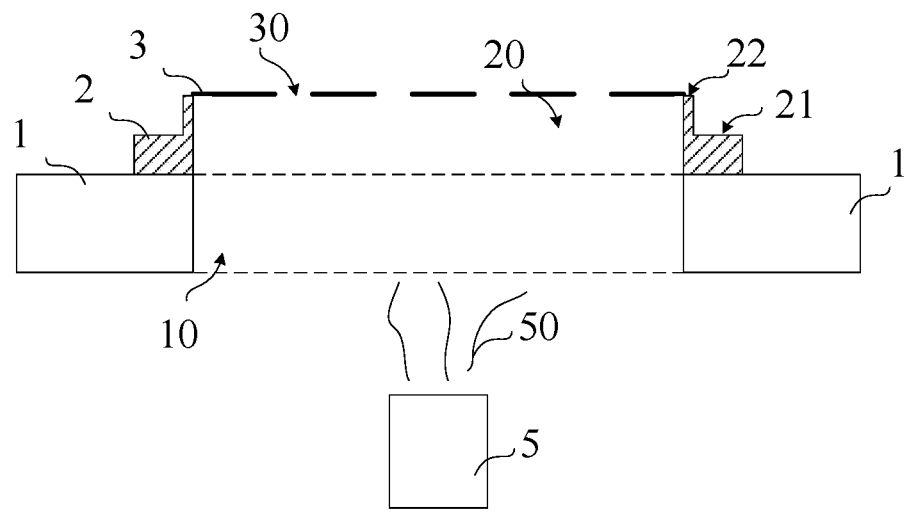
FIG. 1 is a schematic diagram of a structure of an evaporation system.

FIG. 1 is a structural schematic view of an evaporation system. FIG. 2 is a structural top view of the evaporation system illustrated by FIG. 1. Referring to FIG. 1 and FIG. 2, a mask carrier 1 is disposed in an evaporation chamber. A framework 2 is disposed on the mask carrier 1. A metal mask sheet 3 (mould) is disposed on the framework 2.

Here, the mask carrier 1 is columnar or platform-shaped. A first through hole 10 is formed in the middle of the mask carrier 1 and penetrates an upper surface and a lower surface of the mask carrier 1. The framework 2 is of a stepped structure and comprises a first step with a first plane 21 and a second step with a second plane 22. The second step is situated on the first step. The first plane 21 is a step surface of the stepped structure. The framework 2 may be secured to a top surface of the mask carrier 1 by means of bolted connection, etc. A second through hole 20 is formed in the middle of the framework 2, penetrates an upper surface and a lower surface of the framework 2 and is connected with the first through hole 10. The metal mask sheet 3 is secured at an opening of the second through hole 20 in a top surface of the framework 2 by means of welding. An opening 30 that corresponds to a pattern of an organic film layer to be evaporated is formed in the metal mask sheet 3.

Figure 2:
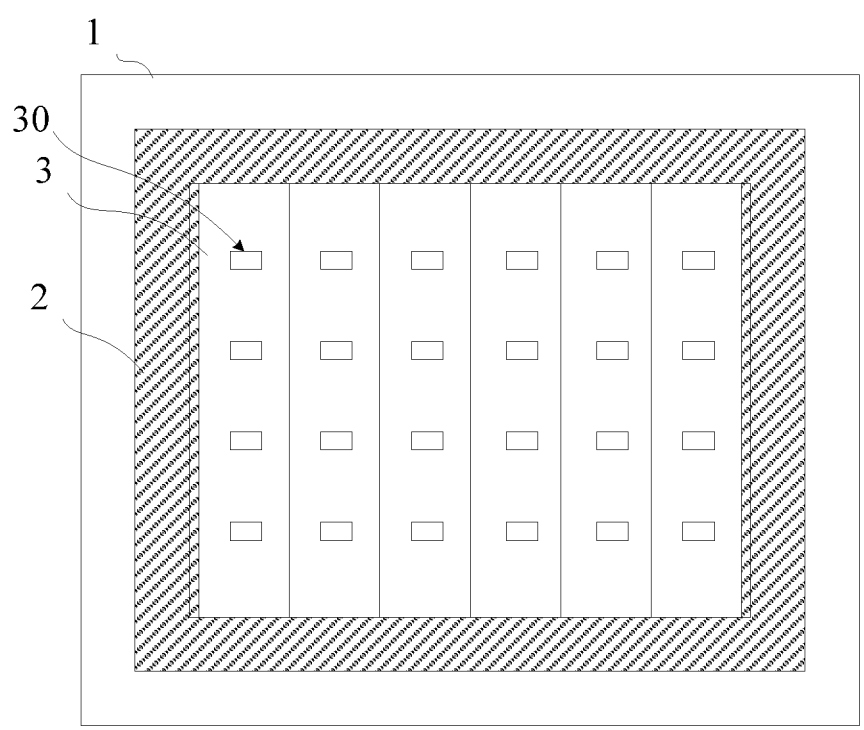
FIG. 2 is a schematic diagram of a structure of an evaporation system.
Figure 3:
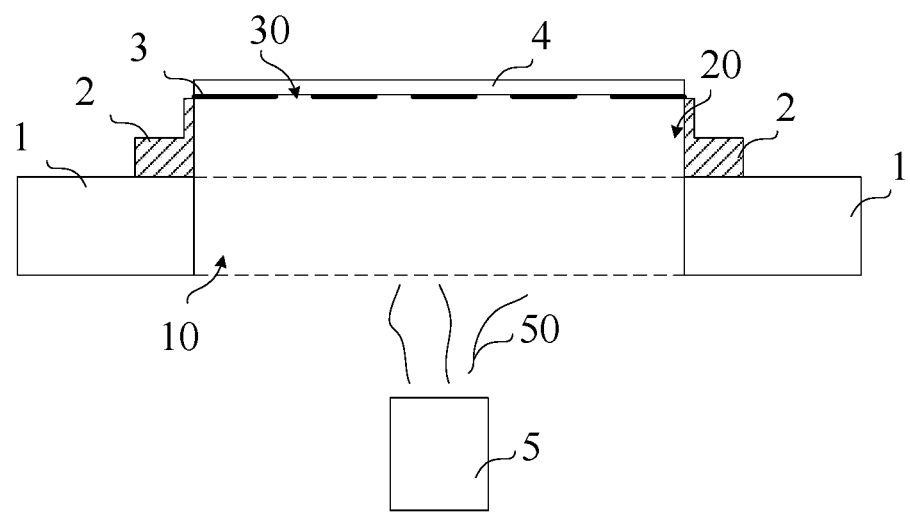
FIG. 3 is a schematic diagram of a structure of an evaporation system.

FIG. 3 is a schematic view of an evaporation process of the evaporation system illustrated by FIG. 1 and FIG. 2. Referring to FIG. 3, during evaporation, the side, onto which the organic film layer needs to be formed, is press-fit on the metal mask sheet 3. A magnetic device (not shown in FIG. 3) is disposed on the side, facing away from the metal mask sheet 3, of a substrate 4 to attract the metal mask sheet 3 onto the substrate 4. A crucible 5 which contains an organic material 50 is disposed below the mask carrier 1. The organic material 50 in the crucible is heated for high-temperature volatilization and then penetrates the first through hole 10 of the mask carrier 1 and a second through hole 20 of the framework 2, and is evaporated on the substrate 4 via the opening 30 to form the organic film layer.

In the above-mentioned structure, as the metal mask sheet 3 is secured to the framework 2 by means of welding, the framework 2 may be deformed (e.g., edge warping) after the metal mask sheet 3 is welded on the framework, resulting in a deformation of the metal mask sheet 3 that is welded on the framework 2, and causing a clearance between the substrate 4 and the metal mask sheet 3. The metal mask sheet 3 situated in the middle of the framework 2 only has two ends welded on the framework 2, and therefore, may be attracted and fit onto the substrate 4 under a magnetic action of the magnetic device. The metal mask sheets 3 situated on two sides of the framework 2 are wholly welded on the framework 2, and therefore, may not be attracted onto the substrate 4 by a magnetic force of the magnetic device when the framework deforms. Thus, there is the relatively larger clearance between the metal mask sheets 3 situated on the two sides of the framework 2 and the substrate 4. The organic material 50 will be diffused in the clearance between the substrate 4 and the metal mask sheets 3 when evaporated onto the substrate 4 from the opening 30 of the metal mask sheet 3, resulting in larger and thinner patterns close to the two sides of the framework 2 than normal patterns, and at last, leading to an unfavorable color mixing of an OLED panel and decrease of the product yield.

Thus, an embodiment of the present disclosure provides a mask carrier with correction fixtures.

Figure 4:
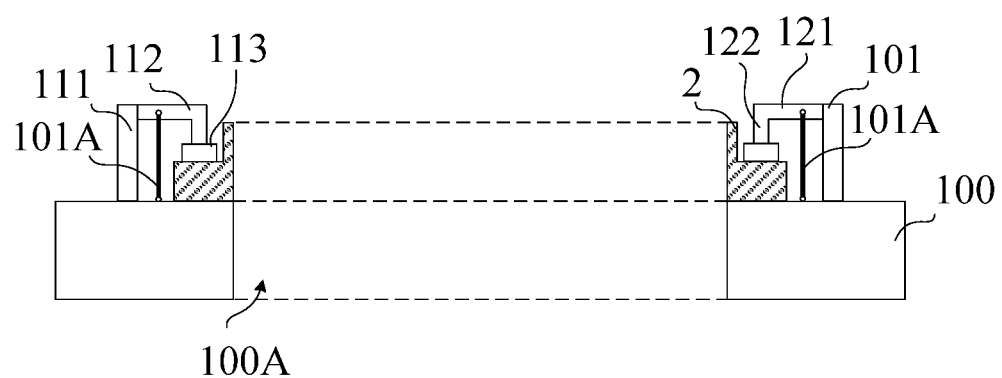
FIG. 4 is a schematic diagram of a structure of a mask carrier according to an embodiment of the present disclosure.

FIG. 4 is a structural schematic view of a mask carrier provided by one embodiment of the present disclosure. Referring to FIG. 4, the mask carrier comprises a base 100 and at least two correction fixtures 101 disposed on the base 100. The at least two correction fixtures 101 are configured to clamp a framework 2 of a metal mask that is placed on the base 100 on the base 100. A first opening 100A that allows an organic material to pass is formed in the base 100. The at least two correction fixtures 101 are disposed around the first opening 100A in a spaced manner.

The mask carrier provided by the embodiment of the present disclosure comprises the base 100 and the at least two correction fixtures 101 which are disposed on the base 100 in a spaced manner. The first opening that allows the organic material to pass is formed in the base 100. During organic evaporation coating, the at least two correction fixtures on the mask carrier press the framework of the metal mask to prevent the framework from deformation. Thus, a clearance between the substrate and the metal mask is reduced or even eliminated after the substrate is in press-fit with a surface of the metal mask. Patterns obtained through evaporation are clear in shape and outline and normal in size. Hence, unfavorable color mixing is avoided. The product yield is increased.

In the embodiment, the metal mask is configured to perform evaporation of the organic film layer on the substrate, besides the framework 2 shown in the figure, further comprises a metal mask sheet that needs to be disposed on the framework 2. The substrate is in press-fit with a surface of the metal mask sheet.

Here, the base 100 is of a columnar structure, including but not limited to a cylindrical structure, a prism structure, etc. The framework 2 is secured to the middle of the top surface of the base 100 and situated above the first opening 100A. Here, the first opening 100A is connected with the second through hole 20 of the framework 2. A projection of the second through hole 20 on the top surface of the base 100 is situated in the first opening 100A. Alternatively, the projection of the second through hole 20 on the top surface of the base 100 is superimposed with the first opening 100A. That is, the first opening 100A is larger than the second opening 20. Alternatively, the first opening 100A and the second opening 20 are the same in size. The first opening 100A may be in the shape of regular graphics including a circle, a rectangle and the like, and may also be in the shape of an irregular graphic.

As shown in FIG. 4, each correction fixture 101 comprises a support rod 111, an L-shaped connecting rod 112 and a press-fit plate 113 configured to compress the framework 2. One end of the support rod 111 is mounted on the base 100. The other end of the support rod 111 is connected to one end of the L-shaped connecting rod 112. The press-fit plate 113 is disposed at the other end of the L-shaped connecting rod 112 and configured to provide a force for clamping the framework. The correction fixture 101 comprises the support rod 111, the L-shaped connecting rod 112 and the press-fit plate 113. One end of the support rod 111 is mounted on the base 100 thereby mounting and fixing of the correction fixture 101 are guaranteed. The press-fit plate 113 is disposed at the other end of the support rod 111 through the L-shaped connecting rod 112. The framework is clamped by means of a press-fit plane of the press-fit plate 110.

In the embodiment of the present disclosure, cross sections of the support rod 111 and the L-shaped connecting rod 112 may be circular, rectangular, etc. That is, the support rod 111 and the L-shaped connecting rod 112 may be round rods or square rods. The support rod 111 and the L-shaped connecting rod 112 may be metal rods, guaranteeing the strength of the whole fixture.

In the embodiment of the present disclosure, the function of the press-fit plate 113 is to compress the framework and may be cylindrical or prismatic to facilitate manufacture and use.

In the embodiment of the present disclosure, the L-shaped connecting rod 112 comprises a cross rod 121 and a vertical rod 122 connected to the cross rod 121. The support rod 111 and the cross rod 121 and the vertical rod of the L-shaped connecting rod 112 may be connected in the following two modes. The first connection mode is that the support rod 111 and the L-shaped connecting rod 112, as well as the cross rod 121 and the vertical rod 122 of the L-shaped connecting rod 112, are in secured connection, e.g., threaded connection, or adopt an integrated design during manufacture. The second connection mode is that the support rod 111 and the L-shaped connecting rod 112, as well as the cross rod 121 and the vertical rod 122 of the L-shaped connecting rod 112, are in. For example, the rotatable connection is realized by means of hinging between the support rod 111 and the L-shaped connecting rod 112, as well as between the cross rod 121 and the vertical rod 122 of the L-shaped connecting rod 112.

To realize a compressing role of the press-fit plate 113, the following two design solutions may be adopted. In one design solution, the press-fit plate 113 may compress the framework by virtue of its own gravity. At this time, the press-fit plate 113 is relatively heavier and may be made of a high-density material, e.g., a high-density metal (e.g., copper). In the other design solution, the press-fit plate 113 may compress the framework by virtue of external power. For example, the correction fixture 101 further comprises a pressure component which is configured to apply a force to the press-fit plate 113 when the press-fit plate 113 is above the framework so as to compress the framework. For example, as shown in FIG. 4, an elastic part (e.g., a spring) 101A may be connected between the L-shaped connecting rod 112 and the base 100. Before assembly of the framework 2 and the metal mask sheet 3 is finished, one end of the elastic part 101A is secured to the L-shaped connecting rod 112 or the base 100. The other end of the elastic part 101A is released. After the assembly of the framework 2 and the metal mask sheet 3 is finished, the other end of the elastic part 101A is also connected to the base 100 or the L-shaped connecting rod 112. As the length of the elastic part 101A in a natural state is smaller than the distance between connection points at two ends of the elastic part 101A, the elastic part 101A is elongated. Thus, an opposite (downward in FIG. 4) tensile force is applied to the press-fit plate 113 to compress the framework 2. Exemplarily, a snap ring or a grab may be disposed on the base 100 or the L-shaped connecting rod 112 to facilitate connection with the other end of the elastic part 101A.

FIG. 4 is a structural schematic view of a correction fixture 101 during operation. For convenient use of the correction fixture 101, the correction fixture 101 provided by the embodiment of the present disclosure may have two states, namely, an operating state and a non-operating state. Here, the non-operating state may adopt two designs which are shown respectively in FIGS. 5-11 and FIGS. 12-13.

Figure 5:
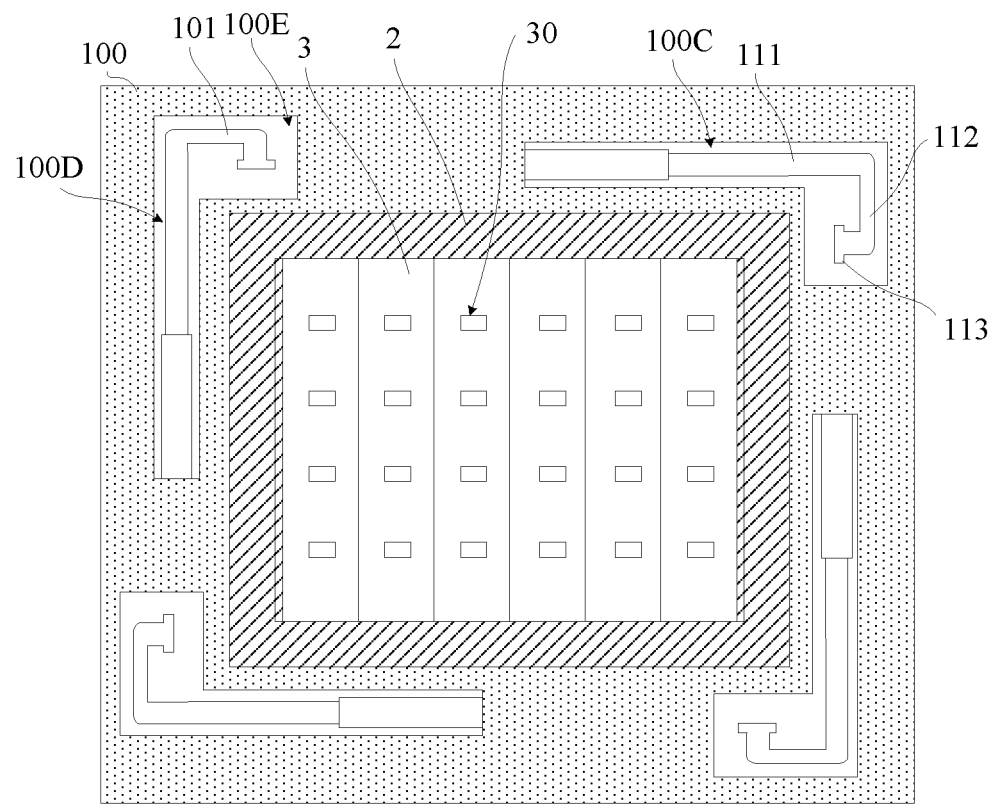
FIG. 5 is a schematic diagram of a structure of another mask carrier according to an embodiment of the present disclosure.
Figure 6:
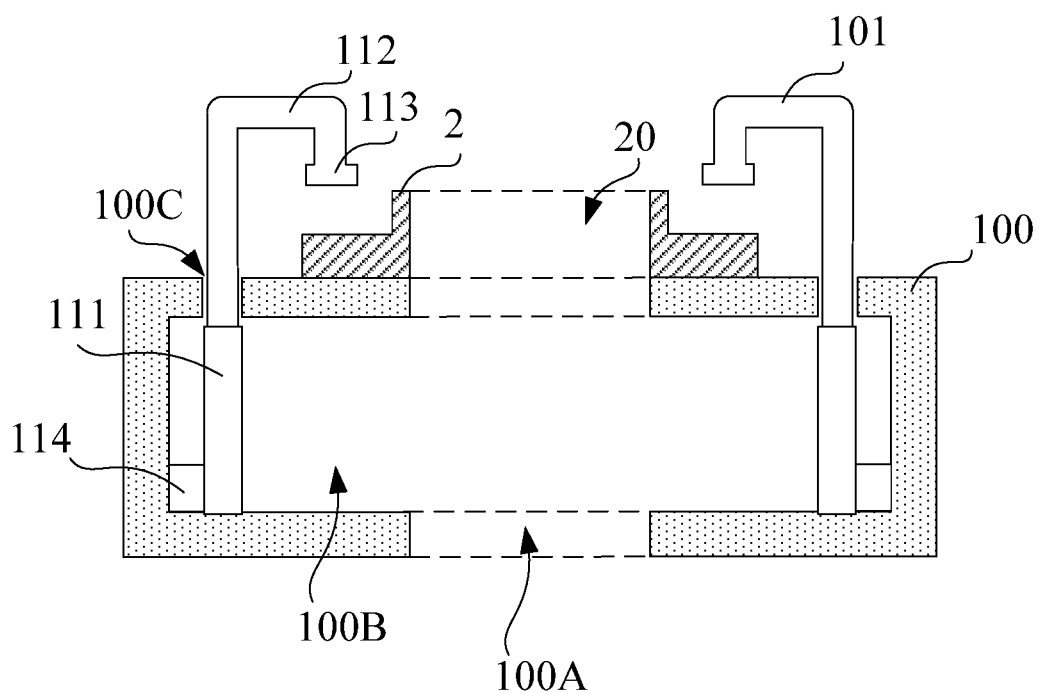
FIG. 6 is a schematic diagram of a structure of another mask carrier according to an embodiment of the present disclosure.
Figure 7:
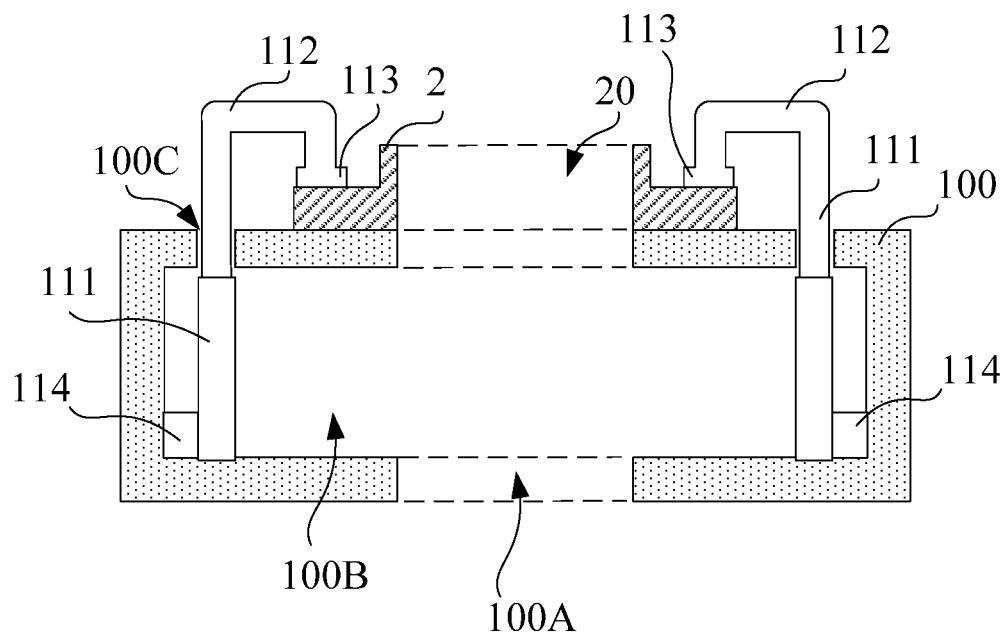
FIG. 7 is a schematic diagram of a structure of another mask carrier according to an embodiment of the present disclosure.

In an implementation of the embodiment of the present disclosure, the mask carrier provided by the embodiment of the present disclosure may adopt the structures as shown in FIGS. 5-7.

Referring to FIGS. 5-7, an accommodating cavity 100B is formed in the base 100. A second opening 100C communicated with the accommodating cavity 100B is formed in a top surface (the side with the framework 2) of the base 100. The correction fixture 101 has a first state (namely, the foregoing non-operating state) and a second state (namely, the foregoing operating state). The correction fixture 101 is disposed inside the accommodating cavity 100B when in the first state. The correction fixture 101 is disposed outside the accommodating cavity 100B when in the second state, and is configured to clamp the framework 2 on the base 100. The second opening 100C allows the correction fixture 101, when it is switched from the first state into the second state, to pass. The correction fixture 101 which does not work is accommodated by the accommodating cavity 100B of the base 100, such that the correction fixture 101 is prevented from impacting such processes as assembly of the framework and the substrate before evaporation.

As shown in FIGS. 5-7, the accommodating cavity 100B and the first opening 100A are connected with each other to facilitate manufacture and machining of the base 100.

As shown in FIGS. 5-7, one end of the support rod 111 is rotatably mounted in the accommodating cavity 100B of the base 100. The support rod 111 may rotate between a first position and a second position around one end of its own. The correction clamp 101 is in the second state when the support rod 111 is in the second position. At this time, a length direction of the support rod 111 is perpendicular to a top surface of the base 100 (as shown in FIGS. 6-7). The correction fixture 101 is in the first state and is situated in the accommodating cavity 100B (as shown in FIG. 5) when the support rod 111 is in the first position. In a process of rotating the support rod 111, the whole correction fixture 101 extends out of or retracts into the accommodating cavity 100B via the second opening 100C.

In the embodiment, to ensure that the whole correction fixture 101 may successfully pass through the second opening 100C, the second opening 100C comprises two portions, namely a long slot 100D and an end portion hole 100E that is connected to one end of the long slot 100D. Here, a length direction of the long slot 100D is perpendicular to a rotating shaft around which one end of the support rod 111 rotates. A projection of the support rod 111 on the top surface of the base 100 is situated in the long slot 100D when the correction fixture 101 is in the first state. The end portion hole 100E allows the L-shaped connecting rod 112 and the press-fit plate 113 to pass when the support rod 111 rotates. Here, the end portion hole 100E may be circular, rectangular, etc.

In the embodiment of the present disclosure, the correction fixture 101 further comprises a power unit which drives the support rod 111 to rotate. The power unit is connected to the support rod 111, and accordingly, drives the support rod 111 to rotate when the power unit works.

Referring to FIGS. 6-7, in this implementation, the power unit may comprise a motor 114 that is disposed in the accommodating cavity 100B of the base 100. An output shaft of the motor 114 is coaxially connected to the rotating shaft of the support rod 111. When the motor 114 works, the output shaft of the motor 114 rotates to drive the support rod 111 to rotate between the first position and the second position. Thus, the whole correction fixture 101 moves.

To ensure that the power unit can provide sufficient power to support rotation of the support rod 111, besides the motor 114, the power unit may further comprise a reducer that is connected between the output shaft of the motor 114 and the rotating shaft of the support rod 111 (that is, an input shaft of the reducer is coaxially connected to the output shaft of the motor, and an output shaft of the reducer is coaxially connected to the rotating shaft of the support rod). The reducer is configured to reduce the rotational speed and to increase the torque, guaranteeing the power provided by the power unit for the support rod 111.

Figure 8:
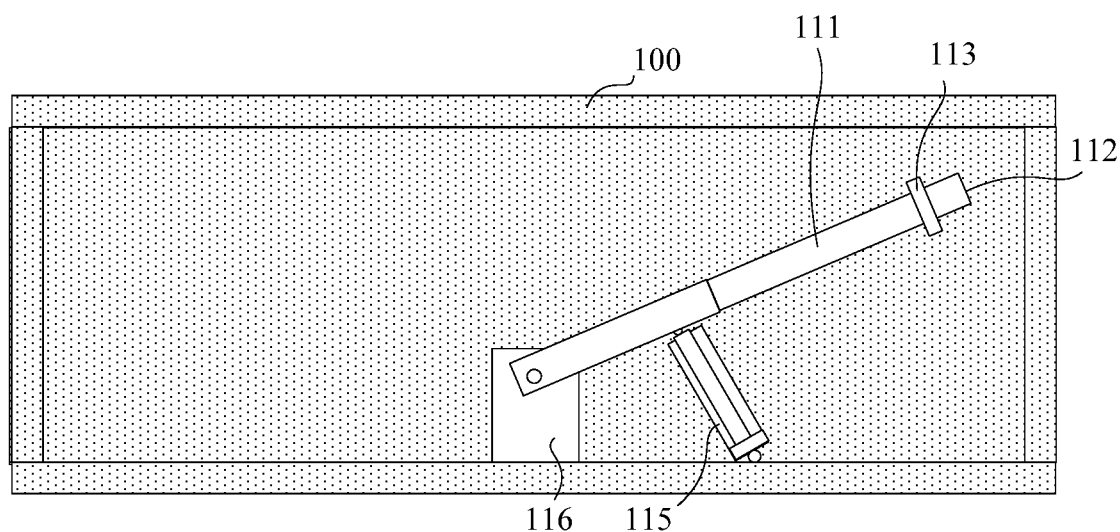
FIG. 8 is a schematic diagram of a structure of another mask carrier according to an embodiment of the present disclosure.
Figure 9:
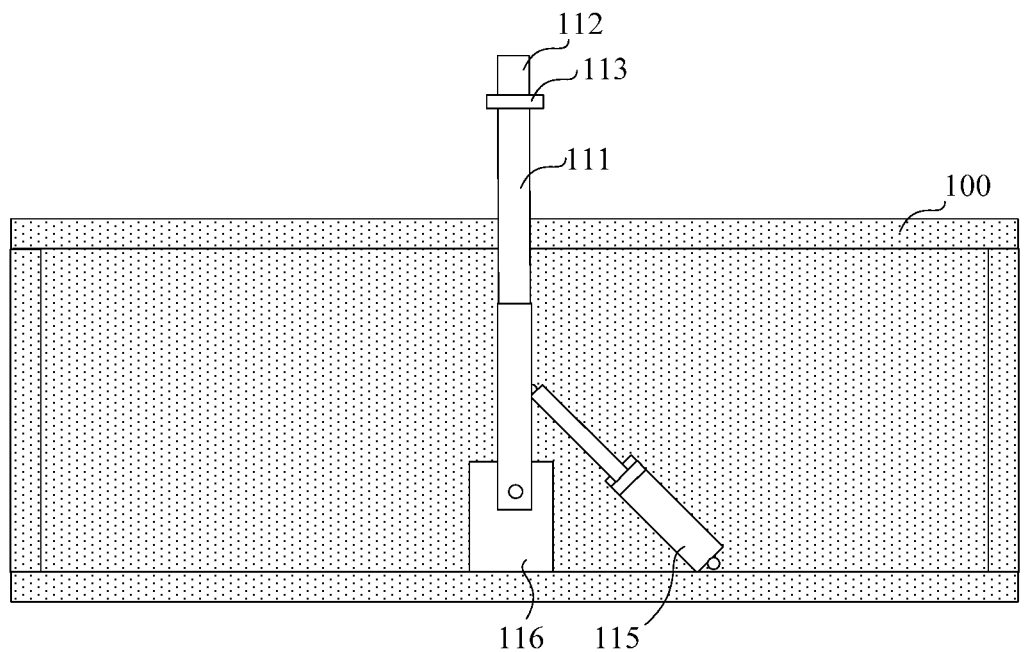
FIG. 9 is a schematic diagram of a structure of another mask carrier according to an embodiment of the present disclosure.

Besides that the power unit illustrated in FIGS. 6-7 is adopted to realize rotation of the support rod 111, the embodiment of the present disclosure further comprises a format of the power unit as shown in FIGS. 8-9 which illustrate sectional views of the base 100. Referring to FIGS. 8-9, the power unit comprises a telescopic cylinder 115 and a mounting base 116. One end of the support rod 111 is mounted on the mounting base 116. The rotating shaft of the support rod 111 is secured to the mounting base 116. One end of the telescopic cylinder 115 is rotatably connected to the bottom of the accommodating cavity 100B in the base 100. The other end of the telescopic cylinder 115 is rotatably connected to the middle of the support rod 111. The support rod 111 is in the second position when the telescopic cylinder 115 extends to a first length, and is in the first position when the telescopic cylinder 115 retracts to a second length. The telescopic cylinder 115 is controlled to extend and retract to control the state of the whole correction fixture 101. Here, the mounting base 116 is secured to the bottom of the accommodating cavity and is situated below the second opening 100C.

Here, the telescopic cylinder includes but not limited to a hydraulic cylinder or a gas cylinder. When the telescopic cylinder is the hydraulic cylinder or the gas cylinder, the power unit further comprises a pump configured to pump a liquid or a gas into the hydraulic cylinder or the gas cylinder.

When the solution illustrated by FIGS. 5-7 or the solution illustrated by FIGS. 8-9 is adopted to receive the correction fixture 101 in the non-operating state in the accommodating cavity 100B, besides that the support rod 111 needs to be controlled to rotate, it also needs to be guaranteed that the support rod 111 may not be blocked by the framework 2 in the rotating process. The press-fit plate 113 may smoothly compress tightly the framework 2 when the support rod 111 rotates to the second position. Thus, in a process of rotating from the first position to the second position, the length of the support rod 111 should be larger than that of the support rod 111 which reaches the second position.

For example, the support rod 111 provided by the embodiment of the present disclosure may be a telescopic rod. The support rod 111 is in an elongated state in the rotating process, and starts to be shortened when reaching the second position. Thus, the press-fit plate 113 is driven to press the framework 2.

In this case, the press-fit plate 113 may compress the framework 2 through a contractive tensile force of the support rod 111. To guarantee that the support rod 111 may compress the framework 2 during a contraction, the correction fixture 101 adopts the first connection solution. That is, the support rod 111 and the L-shaped connecting rod 112, as well as the cross rod 121 and the vertical rod 122 of the L-shaped connecting rod 112, are connected in secured connection mode.

Here, the telescopic rod may be a hydraulic rod, an electric lifting screw or the like, which will not be limited by the embodiment of the present disclosure. When the telescopic rod is the hydraulic rod, it is easy to know that the support rod further comprises a pump configured to pump a liquid into the hydraulic rod.

In the embodiment of the present disclosure, the mask carrier further comprises a control unit configured to control the power unit to work and also to control the length of the support rod 111. The control unit controls the power unit and the support rod 111 to work so as to guarantee normal operation of the correction fixture 101.

Alternatively, the control unit is configured to control the power unit to drive the support rod to rotate from the first position to the second position when receiving a first instruction, to control the support rod 111 to retract when the support rod is in the second position, to control the support rod 111 to extend when receiving a second instruction, and to control the power unit to drive the support rod to rotate from the second position to the first position after the support rod 111 extends. Here, the first instruction and the second instruction may be input by a worker. The first instruction is for instructing the correction fixture 101 to start to work. The second instruction is for instructing the correction fixture 101 to finish working.

Here, when the power unit or the support rod is a hydraulic cylinder or a hydraulic rod, during control, the control unit directly controls a pump that provides the liquid for the hydraulic cylinder or the hydraulic rod.

When the solution illustrated by FIGS. 5-7 or the solution illustrated by FIGS. 8-9 is adopted, the support rod 111 has the same second position but slightly different first positions. As shown in FIGS. 6-7, the support rod 111 is transversely (parallel to the top surface of the base 100) disposed in the accommodating cavity 100B of the base 100 when in the first position. As shown in FIGS. 8-9, referring to FIG. 8, the support rod 111 is obliquely disposed in the accommodating cavity 100B of the base 100.

Figure 10:
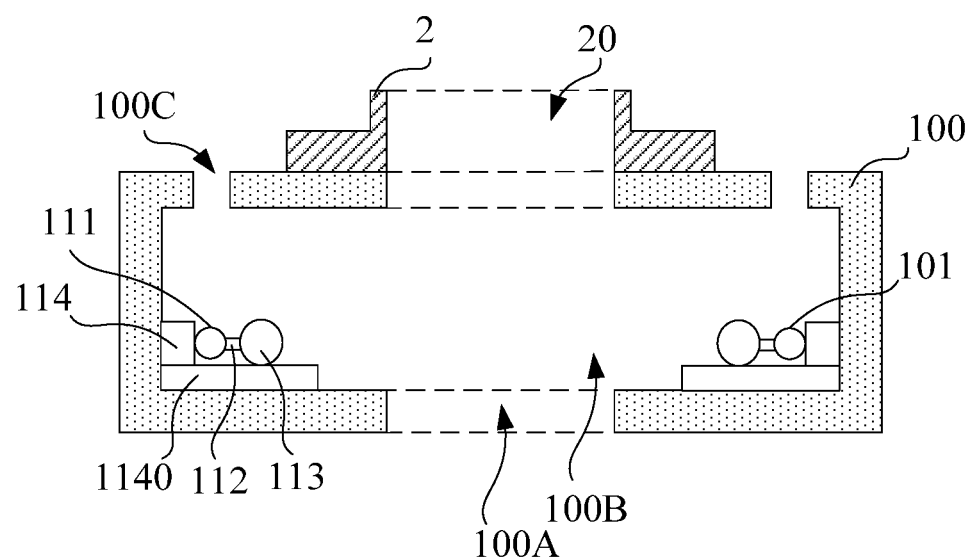
FIG. 10 is a schematic diagram of a structure of another mask carrier according to an embodiment of the present disclosure.
Figure 11:
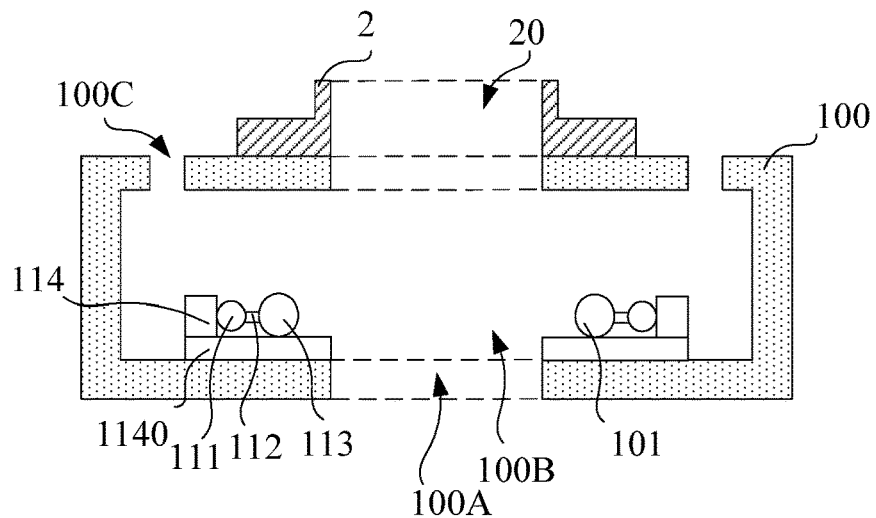
FIG. 11 is a schematic diagram of a structure of another mask carrier according to an embodiment of the present disclosure.

Optionally, a slideway is disposed in the accommodating cavity 100B of the base 100. Referring to FIG. 10 and FIG. 11, the slideway 1140 extends from the lower portion of the second opening 100C to the middle of the base 100. The correction fixture 101 is mounted on the slideway 1140 in a slideable manner, and may transversely move in the accommodating cavity 100B by means of the slideway 1140. That is, the correction fixture 101 moves in a plane that is parallel to the top surface of the base 100, e.g., moves from the lower portion of the second opening 100C to the middle of the accommodating cavity 100B. Thus, the correction fixture 101 may be completely concealed in the non-operating state for protection.

FIG. 10 and FIG. 11 are structural views of a slideway on the basis of the structures shown by FIG. 6 and FIG. 7. The support rod 111, the L-shaped connecting rod 112, the press-fit plate 113 and the motor 114 may move between two positions via the slideway 1140.

Here, the slideway may comprise a slide rail, a slider and a driving motor. A rack is disposed on the slider. A gear is disposed on an output shaft of the driving motor and meshed with the rack. Further, the slider is driven to slide by the driving motor.

Besides, when receiving the first instruction, the control unit is configured to control the driving motor to transport the power unit and the support rod to be below the second opening, and then executes follow-up control actions. Similarly, when the correction fixture retracts into the accommodating cavity after use, the driving motor is controlled to transport the power unit and the support rod to be away from the lower portion of the second opening.

Figure 12:
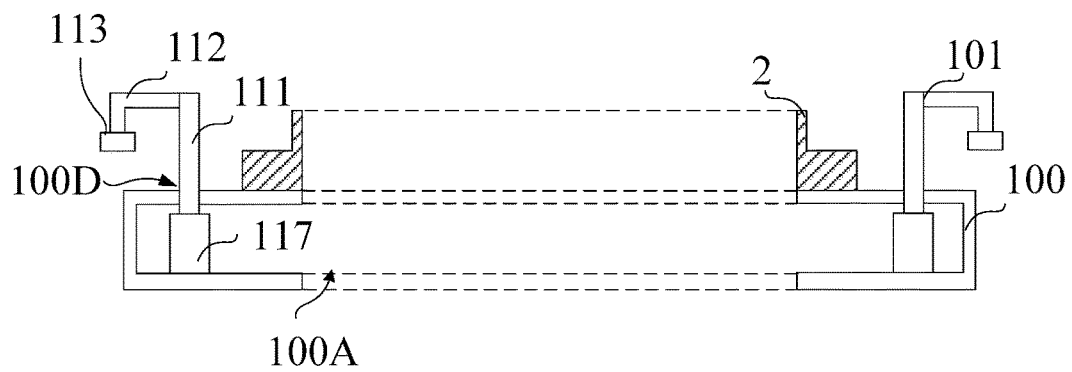
FIG. 12 is a schematic diagram of a structure of another mask carrier according to an embodiment of the present disclosure.
Figure 13:
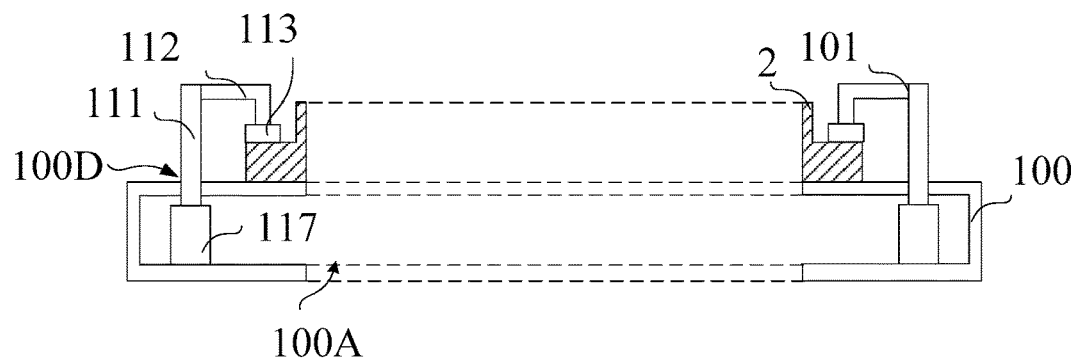
FIG. 13 is a schematic diagram of a structure of another mask carrier according to an embodiment of the present disclosure.

In another example of the embodiment of the present disclosure, the mask carrier provided by the embodiment of the present disclosure may adopt the structures as shown in FIG. 12 and FIG. 13. Referring to FIG. 12 and FIG. 13, the support rod 111 of the correction fixture 101 is rotatably disposed on the base 100. The rotating shaft of the support rod 111 is superimposed with an axis of the support rod 111. The support rod 111 drives the press-fit plate 113 to switch between a third position and a fourth position during rotation. A press-fit plane of the press-fit plate 113 presses the framework when the press-fit plate 113 is in the third position (as shown in FIG. 13). The projection of the support rod 111 on the top surface of the base 100 is situated between a projection of the press-fit plate 113 on the top surface of the base 100 and a projection of the framework 2 on the top surface of the base 100 when the press-fit plate 113 is in the fourth position (as shown in FIG. 12). When the correction fixture 101 starts to work, the support rod 111 rotates to ensure that the press-fit plate 113 rotates from the third position to the fourth position. When the correction fixture 101 finishes working, the support rod 111 rotates to ensure that the press-fit plate 113 rotates from the fourth position to the third position. The support rod 111 rotates to adjust the position of the press-fit plate 113, such that the press-fit plate 113 may play a correcting role during evaporation and may not impact assembly of the framework, the substrate, etc. when not working.

As shown in FIG. 12 and FIG. 13, in this example, the lower end of the support rod 111 penetrates the top surface of the base 100 to be connected to a power mechanism 117 disposed in the base 100. The power mechanism 117 rotates to drive the support rod 111 to rotate. Exemplarily, the through hole 100D is formed in the top surface of the base 100. The lower end of the support rod 111 penetrates the through hole 100D formed in the base 100. Here, the power mechanism 117 may be a motor and may be controlled by the control unit. Referring to the description of the control unit in the another foregoing example for the example of the control unit, which will not be limited herein.

Here, the through hole 100D may be a circular hole or other through holes in regular or irregular shapes.

In this example, the power mechanism 117 may not only be disposed in the base 100 but also be directly disposed on the top surface of the base 100. In contrast, the space may be saved by disposing the power mechanism 117 in the base.

In this example, the correction fixture 101 may adopt the foregoing first connection mode or the foregoing second connection mode.

In the embodiment of the present disclosure, the mask carrier comprises four correction fixtures 101 which are respectively disposed at the four edges or the four vortexes of a rectangle. The four vortexes of the rectangle correspond to four corners of the framework 2 disposed on the base 100. Here, that the four vortexes of the rectangle correspond to the four corners of the framework 2 disposed on the base 100 means that the four edges of the rectangle are respectively parallel to the four edges of a rectangle formed by the four corners of the framework 2. As the four fixtures are disposed, the framework is press-fit in all directions, guaranteeing a press-fit effect and the quality of evaporated patterns.

Figure 14:
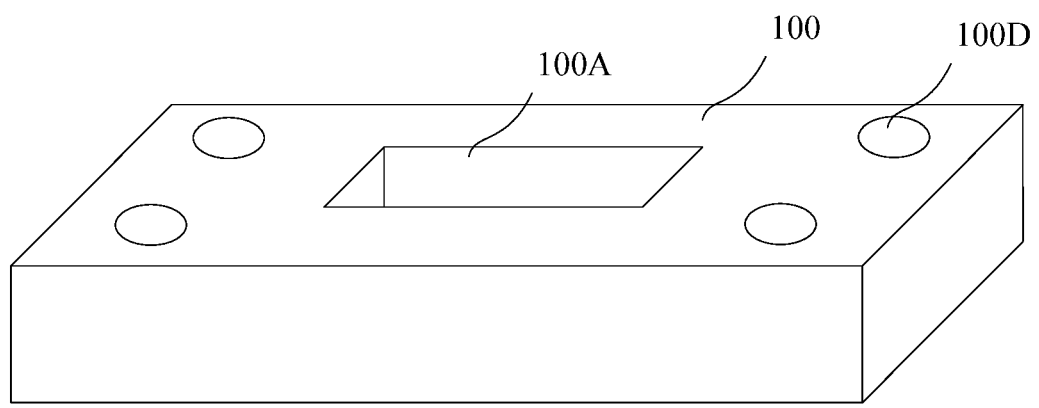
FIG. 14 is a schematic diagram of a structure of a base according to an embodiment of the present disclosure.

Exemplarily, refer to the structure illustrated by FIG. 5 for that the four correction fixtures 101 are respectively disposed at the four edges of the rectangle, and refer to the structure illustrated by FIG. 14 for that the four correction fixtures 101 are respectively disposed at the four vortexes of the rectangle. Here, FIG. 14 is a structural schematic view of a base provided by an embodiment of the present disclosure. As shown in FIG. 14, the base 100 may be a cuboid. When the mask carrier includes the four correction fixtures 101, the through holes 100D in the base may be formed in four corners of a top surface of the cuboid as shown in the figure. The four vortexes of the rectangle formed by the four through holes 100D correspond to four corners of the framework 2 on the base 100.

An embodiment of the present disclosure further provides an evaporation system, comprising an evaporation chamber, as well as a mask carrier and a metal mask that are disposed in the evaporation chamber, wherein the metal mask is disposed on the mask carrier, the mask carrier is the mask carrier shown in any one of FIG. 4 to FIG. 14.

The mask carrier provided by the embodiment of the present disclosure comprises a base and at least two correction fixtures which are disposed on the base in a spaced manner. A first opening which allows the organic material to pass is formed in the base. During organic evaporation coating, the at least two correction fixtures on the mask carrier press the framework of the metal mask to prevent the framework from deformation. Thus, a clearance between a substrate and the metal mask is reduced or even eliminated after the substrate is in press-fit with a surface of the metal mask. Patterns obtained through evaporation are clear in shape and outline and normal in size. Hence, unfavorable color mixing is avoided. The product yield is increased.

The foregoing descriptions are only exemplary embodiments of the present disclosure, and are not intended to limit the present disclosure. Within the spirit and principles of the disclosure, any modifications, equivalent substitutions, improvements, etc., are within the scope of protection of the appending claims of the present disclosure.

What is claimed is:

1. A mask carrier, comprising:
   a base; and
   at least two correction fixtures on the base, wherein the at least two correction fixtures are configured to clamp, on the base, a framework of a metal mask, the base has a first opening, and the at least two correction fixtures are around the first opening in a spaced manner,
   wherein an accommodating cavity is inside the base, a second opening that is connected with the accommodating cavity is on a top surface of the base, the correction fixture has a first state and a second state, is entirely inside the accommodating cavity when in the first state and partially outside the accommodating cavity when in the second state, and is configured to clamp the framework on the base, and the second opening allows the correction fixture, when it is switched from the first state to the second state, to pass through.

2. The mask carrier according to claim 1, wherein each of the correction fixtures comprises a support rod, an L-shaped connecting rod and a press-fit plate for compressing the framework, one end of the support rod is on the base, the other end of the support rod is connected to one end of the L-shaped connecting rod, and the press-fit plate is at the other end of the L-shaped connecting rod.

3. The mask carrier according to claim 2, wherein one end of the support rod is rotatable in the accommodating cavity, the support rod may rotate between a first position and a second position around one end of its own, a length direction of the support rod is perpendicular to the top surface of the base when the support rod is in the second position, and the correction fixture is in the first state when the support rod is in the first position.

4. The mask carrier according to claim 3, wherein the second opening comprises a long slot and an end portion hole connected to one end of the long slot, a length direction of the long slot is perpendicular to a rotating shaft around which one end of the support rod rotates, a projection of the support rod on the top surface of the base is inside the long slot when the correction fixture is in the first state, and the end portion hole allows the L-shaped connecting rod and the press-fit plate to pass when the support rod rotates.

5. The mask carrier according to claim 3, wherein the correction fixture further comprises a power unit configured to drive the support rod to rotate and connected to the support rod.

6. The mask carrier according to claim 5, wherein the power unit comprises a motor that is within the accommodating cavity, and an output shaft of the motor is coaxially connected to the rotating shaft of the support rod.

7. The mask carrier according to claim 5, wherein the power unit comprises a telescopic cylinder and a mounting base, one end of the support rod is on the mounting base, one end of the telescopic cylinder is rotatably connected to the bottom of the accommodating cavity, the other end of the telescopic cylinder is rotatably connected to the middle of the support rod, and the support rod is in the second position when the telescopic cylinder extends to a first length, and is in the first position when the telescopic cylinder retracts to a second length.

8. The mask carrier according to claim 5, wherein the support rod is a telescopic rod.

9. The mask carrier according to claim 8, wherein the telescopic rod is a hydraulic rod or an electric lifting screw.

10. The mask carrier according to claim 9, configured to control the power unit to drive the support rod to rotate from the first position to the second position when receiving a first instruction, control the support rod to retract when the support rod is in the second position, control the support rod to extend when receiving a second instruction, and control the power unit to drive the support rod to rotate from the second position to the first position after the support rod extends.

11. The mask carrier according to claim 5, wherein a slideway is within the accommodating cavity and extends from the lower portion of the second opening to the middle of the base, and the correction fixture is on the slideway in a slideable manner.

12. The mask carrier according to claim 2, wherein the support rod of the correction fixture is rotatable on the base, the rotating shaft of the support rod is superimposed with an axis of the support rod, the support rod rotates to drive the press-fit plate to switch between a third position and a fourth position, the press-fit plate presses the framework when in the third position, and the projection of the support rod on the top surface of the base is between a projection of the press-fit plate on the top surface of the base and a projection of the framework on the top surface of the base when the press-fit plate is in the fourth position.

13. The mask carrier according to claim 1, comprising four correction fixtures which are respectively at four edges or four vertexes of a rectangle, wherein the four vertexes of the rectangle correspond to four corners of the framework on the base.

14. An evaporation system, comprising an evaporation chamber, as well as a mask carrier and a metal mask which are within the evaporation chamber, wherein the metal mask is on the mask carrier, the mask carrier comprises a base and at least two correction fixtures on the base, the at least two correction fixtures are configured to clamp, on the base, a framework of the metal mask, the base has a first opening, and the at least two correction fixtures are around the first opening in a spaced manner,
   wherein an accommodating cavity is inside the base, a second opening that is connected with the accommodating cavity is on a top surface of the base, the correction fixture has a first state and a second state, is entirely inside the accommodating cavity when in the first state and partially outside the accommodating cavity when in the second state, and is configured to clamp the framework on the base, and the second opening allows the correction fixture, when it is switched from the first state to the second state, to pass through.

15. The evaporation system according to claim 14, wherein each of the correction fixtures comprises a support rod, an L-shaped connecting rod and a press-fit plate for compressing the framework, one end of the support rod is on the base, the other end of the support rod is connected to one end of the L-shaped connecting rod, and the press-fit plate is at the other end of the L-shaped connecting rod.

16. The evaporation system according to claim 15, wherein one end of the support rod is rotatable in the accommodating cavity, the support rod may rotate between a first position and a second position around one end of its own, a length direction of the support rod is perpendicular to the top surface of the base when the support rod is in the second position, and the correction fixture is in the first state when the support rod is in the first position.

17. The evaporation system according to claim 16, wherein the second opening comprises a long slot and an end portion hole connected to one end of the long slot, a length direction of the long slot is perpendicular to a rotating shaft around which one end of the support rod rotates, a projection of the support rod on the top surface of the base is inside the long slot when the correction fixture is in the first state, and the end portion hole allows the L-shaped connecting rod and the press-fit plate to pass when the support rod rotates.

18. The evaporation system according to claim 15, wherein the support rod of the correction fixture is rotatable on the base, the rotating shaft of the support rod is superimposed with an axis of the support rod, the support rod rotates to drive the press-fit plate to switch between a third position and a fourth position, the press-fit plate presses the framework when in the third position, and the projection of the support rod on the top surface of the base is between a projection of the press-fit plate on the top surface of the base and a projection of the framework on the top surface of the base when the press-fit plate is in the fourth position.

\* \* \* \* \*